United States Patent
Guthrie et al.

(10) Patent No.: US 10,158,321 B2
(45) Date of Patent: Dec. 18, 2018

(54) PHOTOVOLTAIC MOUNTING SYSTEM

(71) Applicant: SolarCity Corporation, San Mateo, CA (US)

(72) Inventors: Trevor B. Guthrie, Santa Rosa, CA (US); Gregory Philip Patnude, San Rafael, CA (US); Brian Despard West, Larkspur, CA (US); David Molina, Oakland, CA (US); Ryan Devine, Richmond, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 15/861,543

(22) Filed: Jan. 3, 2018

(65) Prior Publication Data

US 2018/0191290 A1    Jul. 5, 2018

Related U.S. Application Data

(60) Provisional application No. 62/441,854, filed on Jan. 3, 2017.

(51) Int. Cl.
*H02S 20/23* (2014.01)
*H02S 30/10* (2014.01)
*H01L 31/048* (2014.01)

(52) U.S. Cl.
CPC ............ *H02S 20/23* (2014.12); *H01L 31/048* (2013.01); *H02S 30/10* (2014.12)

(58) Field of Classification Search
CPC ......... H02S 20/23; H02S 30/10; H01L 31/048
See application file for complete search history.

(56) References Cited

U.S. PATENT DOCUMENTS

| | | | | |
|---|---|---|---|---|
| 8,806,813 B2* | 8/2014 | Plaisted | ............ | H01L 31/0422 |
| | | | | 52/173.3 |
| 8,938,932 B1* | 1/2015 | Wentworth | ............ | H02S 20/23 |
| | | | | 52/747.1 |
| 9,647,433 B2* | 5/2017 | Meine | ............ | H02S 40/36 |
| 9,825,581 B2* | 11/2017 | Wildes | ............ | H02S 20/23 |
| 2010/0276558 A1* | 11/2010 | Faust | ............ | F24J 2/5205 |
| | | | | 248/222.14 |
| 2011/0260027 A1* | 10/2011 | Farnham, Jr. | ......... | F24J 2/5207 |
| | | | | 248/309.1 |
| 2013/0125492 A1* | 5/2013 | Molek | ............ | F24J 2/5211 |
| | | | | 52/489.1 |

(Continued)

*Primary Examiner* — Rodney Mintz
(74) *Attorney, Agent, or Firm* — Kilpatrick Townsend & Stockton LLP

(57) ABSTRACT

Methods and systems for mounting an array of photovoltaic modules atop a rooftop are disclosed. In particular the mounting hardware includes a photovoltaic module tray supported above the rooftop by a number of support structures fastened to the rooftop. The photovoltaic module trays include bottom and sidewalls configured to support and align photovoltaic modules along the rooftop. Since the bottom wall supports the weight of the photovoltaic module, the sidewalls can have a thin form-factor that allows the photovoltaic modules trays to be tightly spaced. In this way, the photovoltaic module tray can occupy very little area on the roof allowing the effective collection area of photovoltaic modules supported by the photovoltaic module trays to be significantly larger than photovoltaic modules using wider photovoltaic module frames.

20 Claims, 18 Drawing Sheets

(56) References Cited

U.S. PATENT DOCUMENTS

| | | | |
|---|---|---|---|
| 2015/0129517 A1* | 5/2015 | Wildes | H02S 20/23 211/41.1 |
| 2015/0288320 A1* | 10/2015 | Stearns | H02S 20/23 52/173.3 |
| 2016/0043686 A1* | 2/2016 | Hsueh | H02S 20/23 52/60 |
| 2016/0111997 A1* | 4/2016 | Ganshaw | H02S 20/23 248/224.7 |
| 2016/0268959 A1* | 9/2016 | Meine | H02S 40/36 |
| 2018/0076755 A1* | 3/2018 | Wildes | H02S 20/23 |

* cited by examiner

PHOTOVOLTAIC MOUNTING SYSTEM

CROSS-REFERENCE TO OTHER APPLICATIONS

This application claims the benefit of U.S. Provisional Application No. 62/441,854, filed Jan. 3, 2017, the disclosure of which is incorporated herein by reference in its entirety for all purposes.

BACKGROUND

Photovoltaic modules mounted atop a roof can occupy a substantial amount of the roof depending on the amount of energy output desired. Unfortunately, metal frames used to support conventional photovoltaic modules take up additional area that does not contribute to energy production. Furthermore, installing a large solar array over an existing roof is inherently redundant since the portion of the roof covered by the array will be protected by the array. Also, some potential customers may be opposed to the aesthetic of having a solar array installed over the roof of their home. Consequently, methods and apparatus for better integrating solar energy collection apparatus with roofing materials are desirable.

SUMMARY

This disclosure describes various embodiments that relate to methods and apparatus for mounting photovoltaic modules upon a rooftop.

A photovoltaic module array is disclosed and includes the following: a photovoltaic module; a photovoltaic module tray supporting the photovoltaic module; a base coupled to a rooftop and defining a fastener opening; a fastener, comprising a threaded shaft extending through the fastener opening, the threaded shaft having a head at a first end of the threaded shaft and a screw drive defined by a second end of the threaded shaft; and a support member comprising a recessed central portion and lateral wings arranged on opposing sides of the recessed central portion, the recessed central portion defining a threaded aperture engaged by a portion of the threaded shaft. The lateral wings support one side of the photovoltaic module tray.

A mounting system for a photovoltaic roofing system is disclosed and includes the following: a base mounting bracket, comprising a base portion having a substantially planar geometry and a threaded member projecting away from the base portion; and a support member having a pair of lateral wings and a central recessed portion, the central recessed portion comprising a threaded through-hole engaging the threaded member, and each lateral wing comprising a slot accommodating a vertical module tray connector that bisects the lateral wing and that includes a pair of opposing attachment tabs for securing a pair of adjacent module trays to either side of the bisected lateral wing.

A photovoltaic array is disclosed and includes the following: a plurality of photovoltaic modules distributed across a rooftop, each of the plurality of photovoltaic modules comprising: a photovoltaic module tray; a photovoltaic module disposed within and supported by the photovoltaic module tray; and two or more support structures elevating the photovoltaic module tray above a rooftop. Each of the support structures includes a base coupled to a rooftop; a threaded shaft extending from the base; and a support member comprising a recessed central portion and lateral wings arranged on opposing sides of the central portion, the recessed central portion defining a threaded aperture engaged by a portion of the threaded shaft, the lateral wings supporting one side of the photovoltaic module tray.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
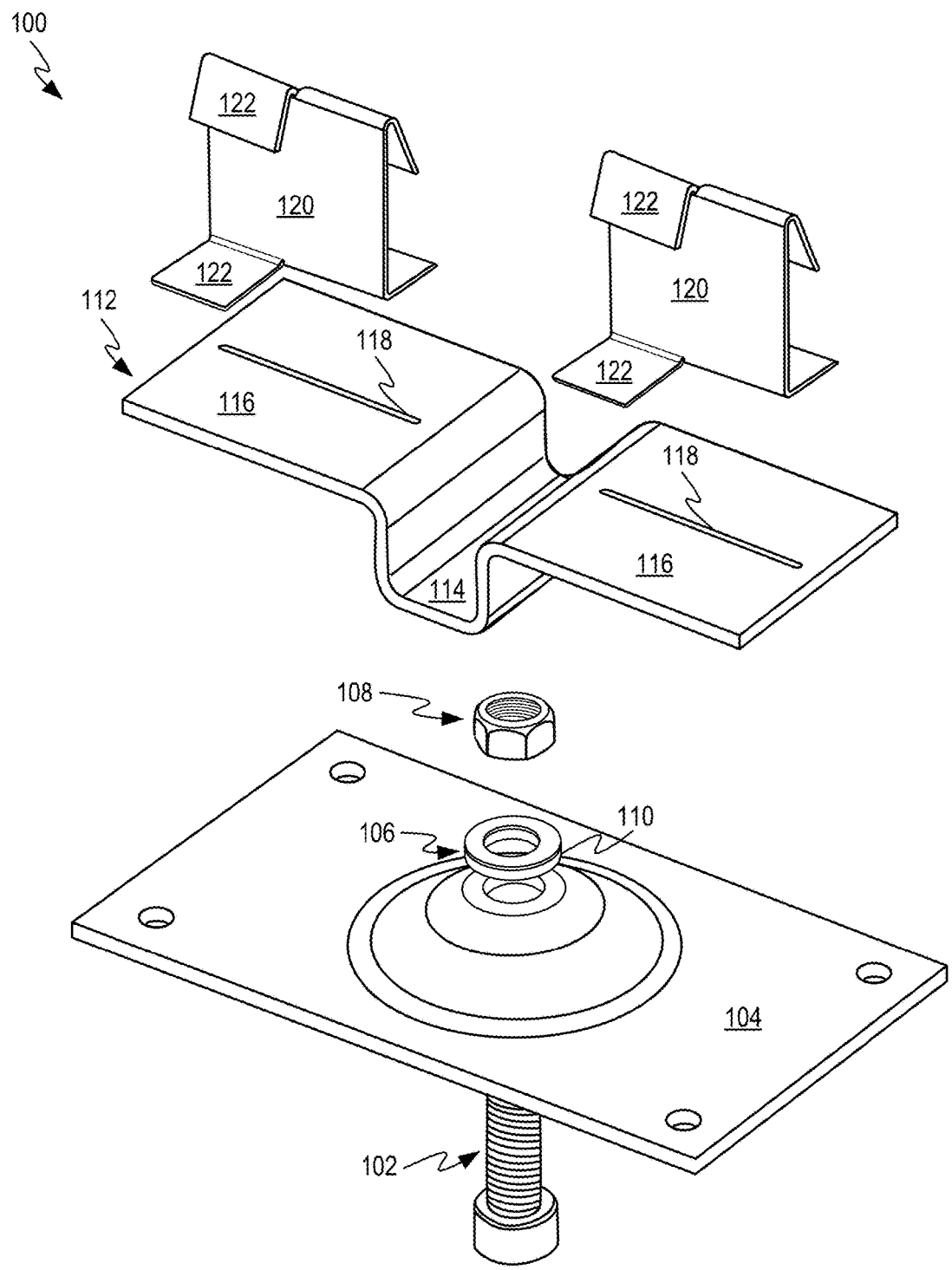
FIG. 1 shows a perspective view of a support structure for securing a photovoltaic module to a rooftop according to various embodiments.

This description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the invention is not limited to the embodiments shown, but is to be accorded the widest scope consistent with the principles and features disclosed herein.

Various embodiments of the invention provide a novel, height-adjustable building integrated photovoltaic (BIPV) system. In some embodiments, an array of photovoltaic modules is mounted to a rooftop using a photovoltaic module tray to support one or more of the photovoltaic modules making up the array. Each photovoltaic module tray may include a bottom wall and sidewalls that function to respectively support and align the photovoltaic modules. The sidewalls can be thin since they function primarily to align the photovoltaic modules in a desired orientation, while the supporting function is carried out primarily by the bottom wall. In some embodiments, top and bottom ends of the photovoltaic module trays may not include sidewalls. By using a photovoltaic module tray without top or bottom sidewalls the photovoltaic modules can be placed in direct contact with adjacent photovoltaic modules located above and below. In addition to making the resulting photovoltaic module array more space efficient and uniform, the close proximity allowed by the thin sidewalls can result in a more aesthetically pleasing array due to the close proximity of adjacent modules resulting in the appearance of one continuous solar collection surface.

A support structure capable of minimizing the distance between the photovoltaic module trays may also increase the available energy generating area of the array. The support structure may include a support bracket that fits snugly between adjacent photovoltaic module trays. A portion of the support bracket can protrude above the photovoltaic module trays. The protruding portion can be malleable enough to be folded over the sidewalls of two adjacent photovoltaic module trays. These folded regions can draw the sidewalls of adjacent photovoltaic module trays firmly against the support bracket so that only the thickness of the support bracket separates the adjacent photovoltaic module trays. In this way, very little space can be lost by the interface between the support structure and the photovoltaic module trays. This support structure also includes an adjustment feature configured to allow a height of the bracket above the rooftop to be adjusted after coupling the photovoltaic module trays to the support bracket in order to account for any variations in the height of the rooftop.

These and other embodiments are discussed below with reference to FIGS. 1-10E; however, those skilled in the art will readily appreciate that the detailed description given herein with respect to these figures is for explanatory purposes only and should not be construed as limiting.

FIG. 1 shows an exploded view of support structure 100 that includes threaded fastener 102 secured to a base such as baseplate 104 by sealing washer 106 and nut 108. Sealing washer 106 can include friction surface 110 configured to control how rapidly threaded fastener 102 can be rotated with respect to baseplate 104. Support structure 100 also includes support bracket 112, which includes central recessed region 114 defining a threaded opening for receiving a distal end of fastener 102. Lateral wings 116 of support bracket 112 define slots 118 configured to receive photovoltaic module tray locking features 120. Locking features 120 include a number of locking tabs 122 that can be folded over or otherwise inserted into slots 118 to secure locking features 120 to support bracket 112 and photovoltaic module trays 308.

Figure 2A:
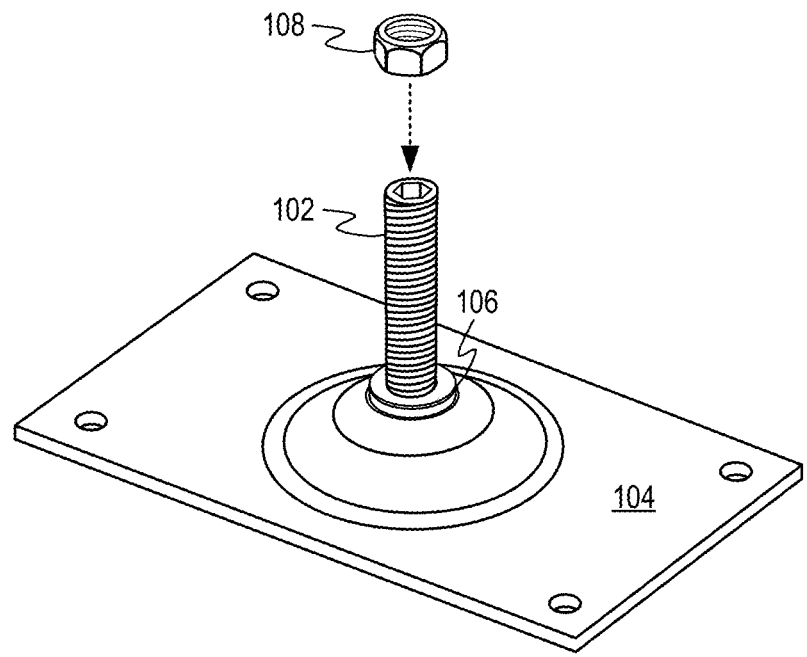
FIGS. 2A-2F show a series of steps for assembling the components depicted in the exploded view of FIG. 1.
Figure 2B:
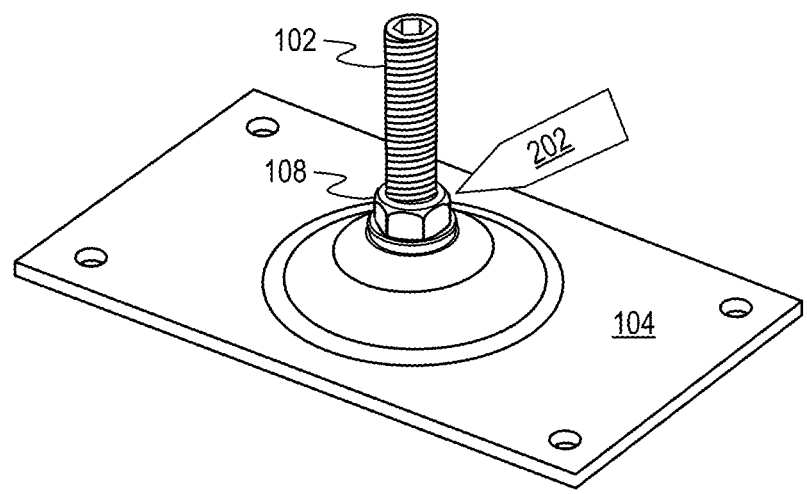

FIGS. 2A-2F show a series of steps for assembling the components depicted in the exploded view of FIG. 1. In particular, FIG. 2A shows a perspective view of fastener 102 engaged within an opening defined by baseplate 104. In various embodiments, baseplate 104 may be positioned on a roof or other support surface at a desired location and then secured to that surface with multiple fasteners driven through the attachment holes defined by respective corners of baseplate 104. In various embodiments, some components may come pre-assembled, such as base plate 104, threaded fastener 102, sealing washer 106 and nut 108. In FIG. 2B, sealing washer 106 is also shown engaged around the threaded shaft of fastener 102. Nut 108 is depicted being aligned with the threaded shaft of fastener 102. FIG. 2B shows a position of nut 108 after being rotated about the threaded shaft of fastener 102 until nut 108 engages sealing washer 106. Nut 108 can be twisted with a predetermined amount of torque that still allows fastener 102 to rotate with respect to baseplate 104 but also prevents undesirable vertical move. Once the position of nut 108 is established on fastener 102, heating element 202 can be applied to nut 108 to fuse nut 108 to the threaded shaft of fastener 102. Alternatively, nut 108 can be secured in this position with respect to fastener 102 by other means such as with adhesive. In this way, any rotation of fastener 102 will not inadvertently change the axial position of nut 108 with respect to fastener 102.

Figure 2C:
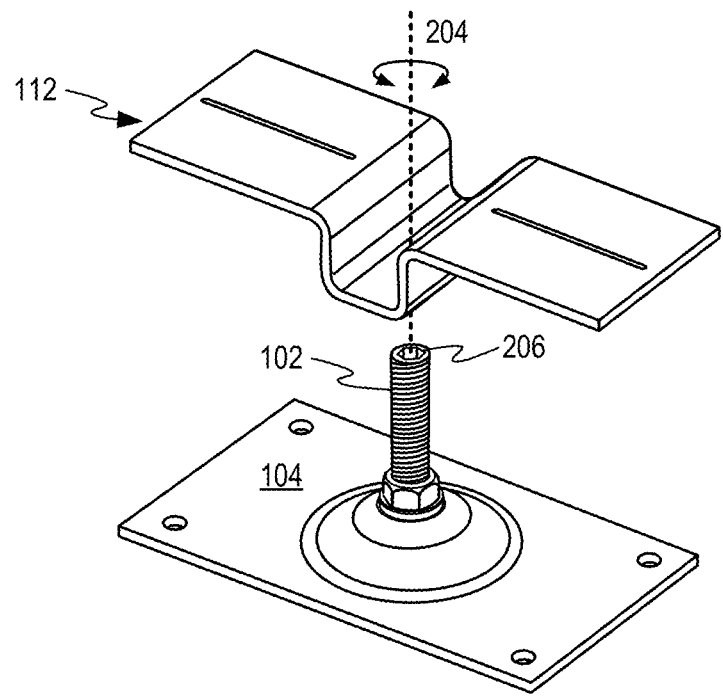
Figure 2D:
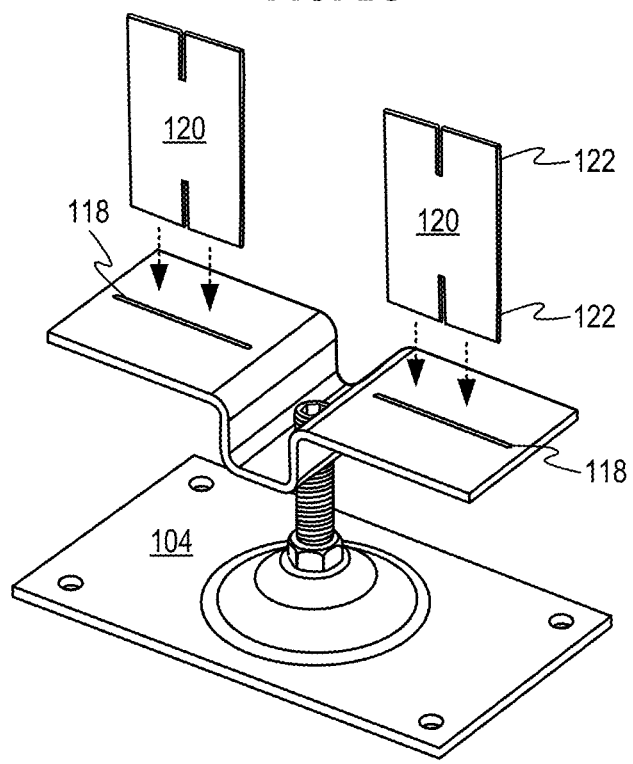

FIG. 2C shows how support bracket 112 can be aligned with fastener 102 and axis of rotation 204. In some embodiments, support bracket 112 has a threaded opening in central recessed region 114 that enables the bracket to be rotated about axis of rotation 204 to secure support bracket 112 to fastener 102 at various heights relative to baseplate 104. In other embodiments, fastener 102 can be rotated by a tool engaging screw drive 206 to secure support bracket 112 to fastener 102. While screw drive 206 is depicted as being hexagonal in geometry it should be appreciated that screw drive 206 can have any geometry suitable for receiving a driver for twisting fastener 102 about axis of rotation 204. FIG. 2D shows support bracket 112 engaged with fastener 102. It should be appreciated that this configuration allows the height of support bracket 112 above baseplate 104 to be varied substantially to suit many different mounting conditions. FIG. 2D also shows how locking features 120 can be inserted into slots 118 defined by support brackets 112 prior to folding locking tabs 122.

Figure 2E:
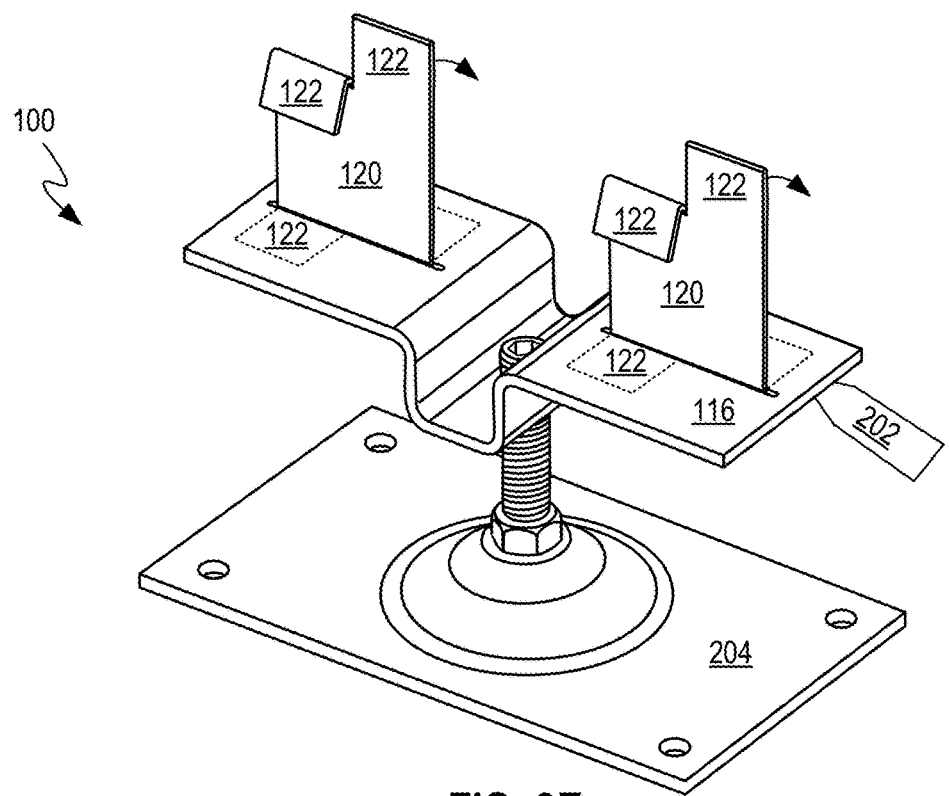
Figure 2F:
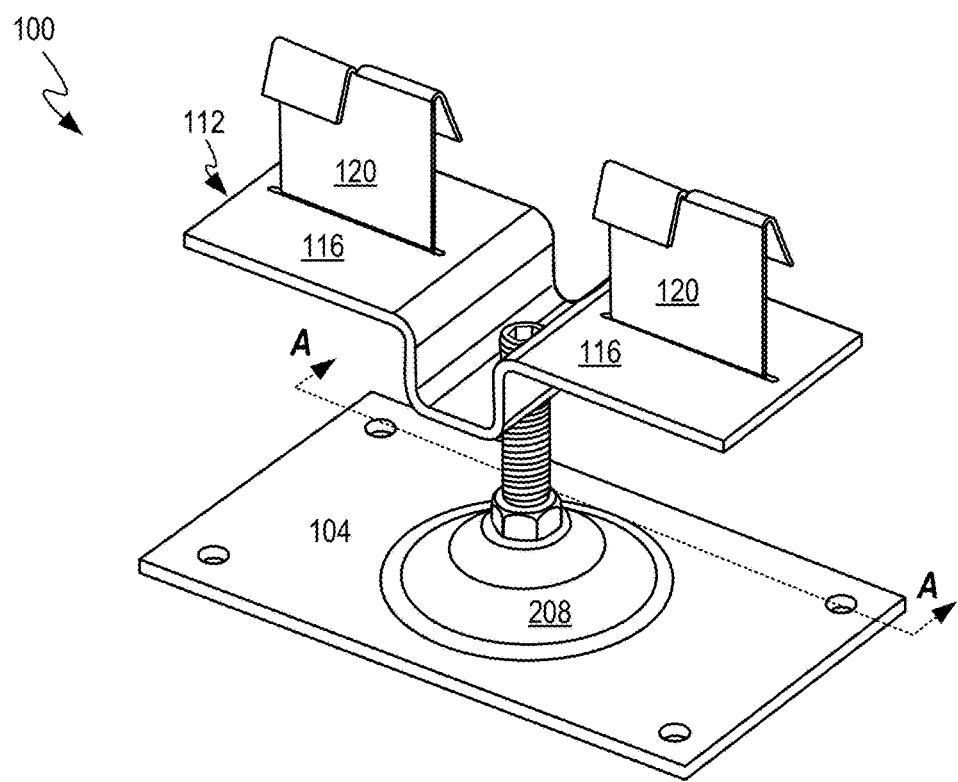

FIG. 2E shows how heating element 202 can be used to secure one of locking tabs 122 to a downward facing surface of lateral wing 116. In some embodiments, heating element 202 can take the form of a welding tool used to fuse locking tabs 122 to lateral wings 116. In some embodiments, locking tabs 122 can be soldered to lateral wings 116. The strength of this coupling between locking tabs 122 and lateral wings 116 need not be terribly robust since any substantial force being applied to locking feature 120 will typically act in an upward direction. For this reason, a force great enough to dislodge locking tabs 122 from lateral wings 116 would have to overcome the soldered coupling and bend locking tabs 122 into a shape that would fit through slot 118. FIG. 2E also shows a direction in which a force can act to bend upper locking tabs 122. In most installation operations, an installer can wait to bend upper locking tabs 122 until after photovoltaic module trays are resting upon lateral wings 116. FIG. 2F shows support structure 100 full configured. It should be noted that baseplate 104, support bracket 112 and locking features 120 may all be formed of sheet metal. For example, baseplate 104 can be formed of a sheet of metal stamped to form central protrusion 208.

Figure 3A:
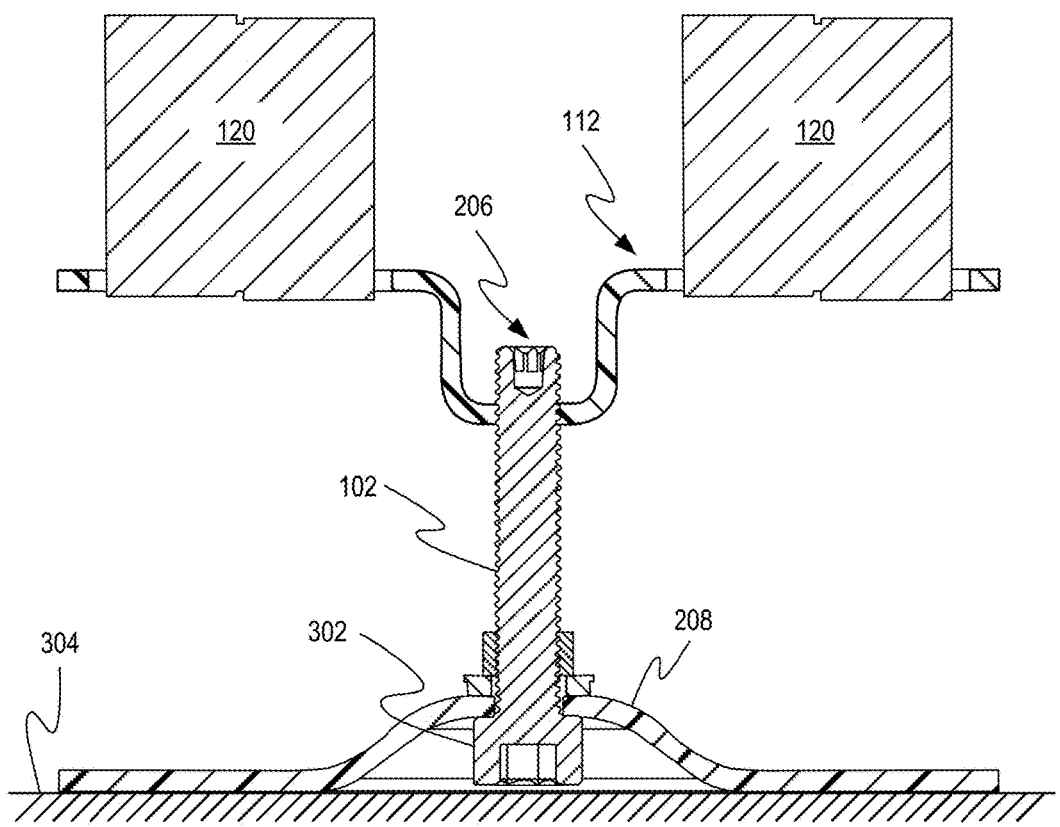
FIG. 3A shows a cross-sectional side view of the support structure in accordance with section line A-A as depicted in FIG. 2F.

FIG. 3A shows a cross-sectional side view of support structure 100 in accordance with section line A-A from FIG.

2F. FIG. 3A shows how locking features 120 extend through support bracket 112. FIG. 3A also shows how protrusion 208 can be tall enough to support a thickness of fastener head 302 of fastener 102 above support surface 304, such that contact between fastener head 302 and support surface 304 can be avoided.

Figure 3B:
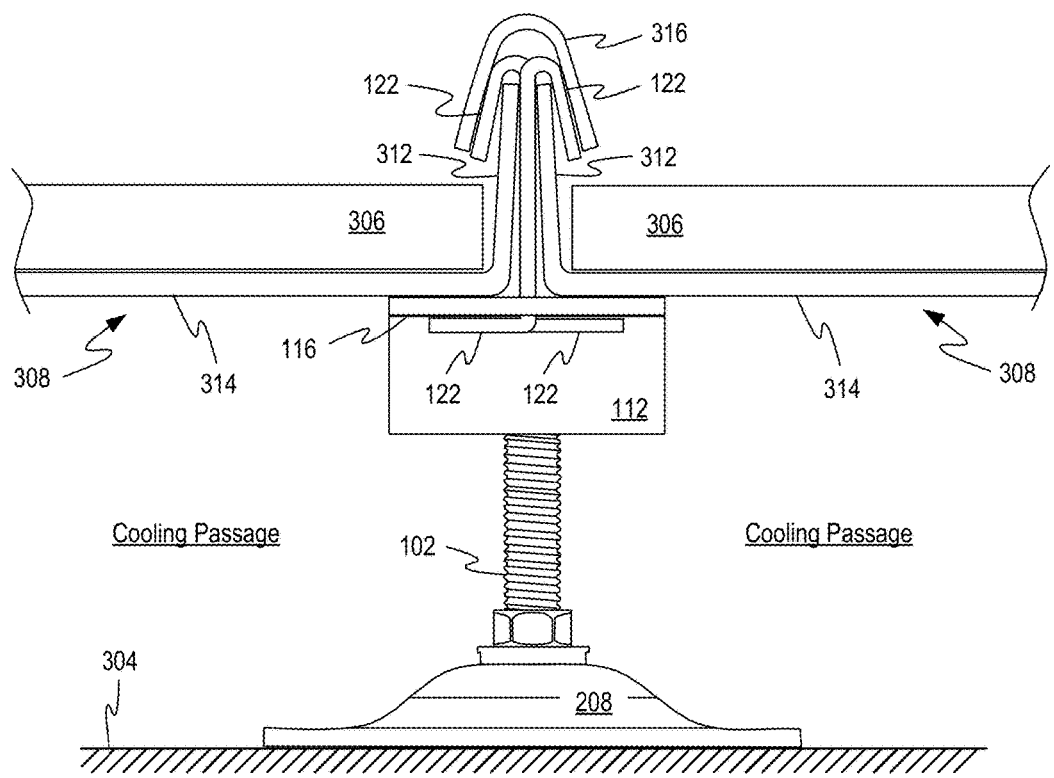
FIG. 3B shows a side view of a support structure supporting photovoltaic modules 306 in cooperation with photovoltaic module trays according to various embodiments.

FIG. 3B shows a side view of support structure 100 supporting photovoltaic modules 306 in cooperation with photovoltaic module trays 308. FIG. 3B also shows how locking tabs 122 engage sidewalls 312 of photovoltaic module trays 308. Sidewalls 312 are shown deforming against an interior facing surface of locking features 120. FIG. 3B also shows how support bracket 112 is able to support two adjacent photovoltaic module trays 308 and their corresponding photovoltaic modules 306 above support surface 304. Because bottom walls 314 support most of the weight of photovoltaic modules 306, bottom walls 314 can be thicker than sidewalls 312. Waterproofing element 316 can be arranged to cover the interface between photovoltaic module trays 308. By extending from one end of each of the interfaces between photovoltaic module trays 308 to the other an array of photovoltaic modules can be configured to block rain from impacting the rooftop below the array of photovoltaic modules. In this way, the array of photovoltaic modules can act to replace a portion of the rooftop above which the photovoltaic modules are positioned. In some embodiments a skirt can surround portions of the photovoltaic array to prevent water from rolling beneath it.

Another advantage of support structure 100 is that it creates a cooling passage between support surface 304 and photovoltaic module trays 308. In some embodiments, bottom walls 314 can define openings to assist in shedding heat to the outside air via the cooling passages disposed beneath the photovoltaic modules. The distance between photovoltaic module trays 308 and support surface 304 can be set so that a sufficient amount of air for cooling photovoltaic modules 306 during the day can pass through the cooling passages. The upward slant of most rooftops will generally cause warm air to flow from a bottom edge of a photovoltaic module array to a top edge.

Figure 4:
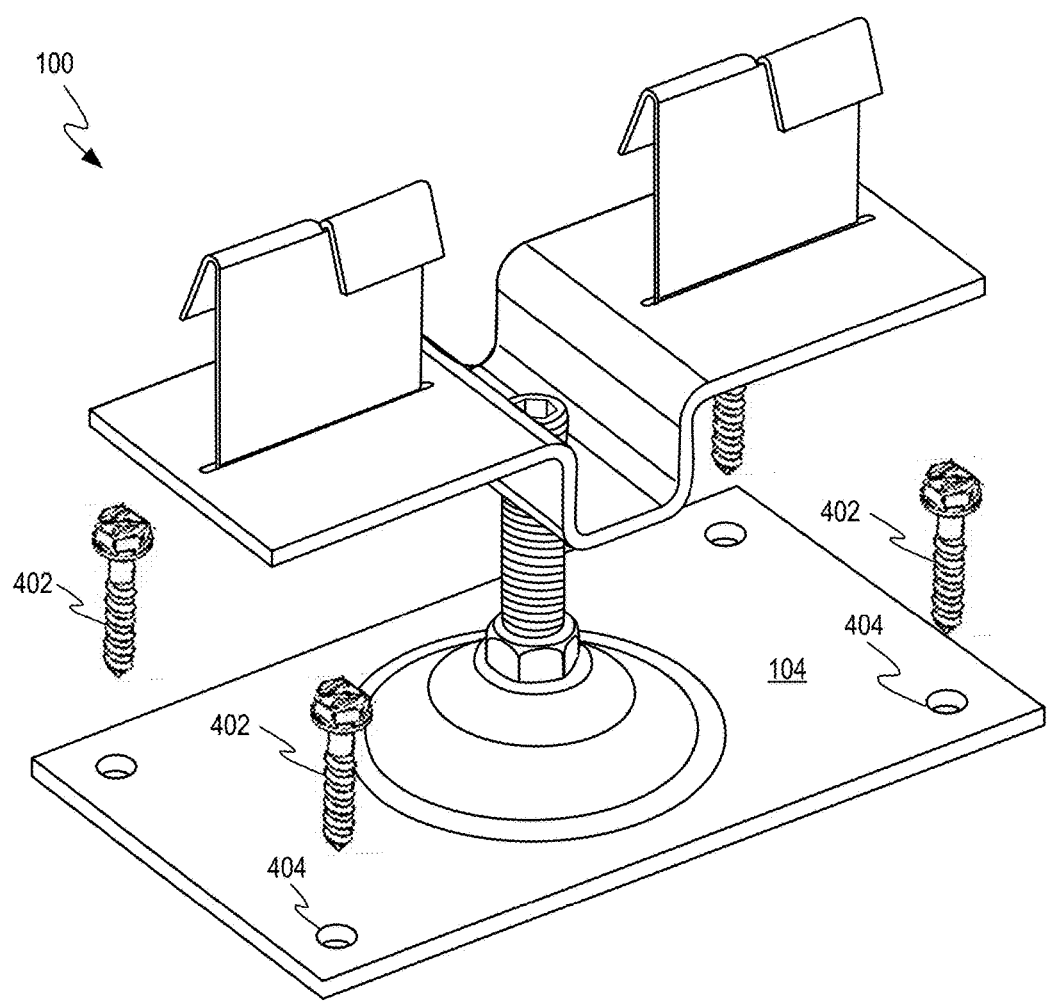
FIG. 4 shows how fasteners can be used to secure a support structure to a rooftop by engaging fastener openings defined by a baseplate 104 according to various embodiments.

FIG. 4 shows how fasteners 402 can be used to secure support structure 100 to a rooftop by engaging screw openings 404 defined by baseplate 104. In this way, the pointed ends of threaded shafts of fasteners 402 can engage and be secured to roofing material beneath baseplate 104 to securely couple support structure 100 to the rooftop. It should be appreciated that baseplate 104 can be secured to the rooftop in other ways. For example, the rooftop could define recesses for receiving baseplate 104. In some embodiments, baseplate 104 could be integrally formed with a roof tile.

Figure 5A:
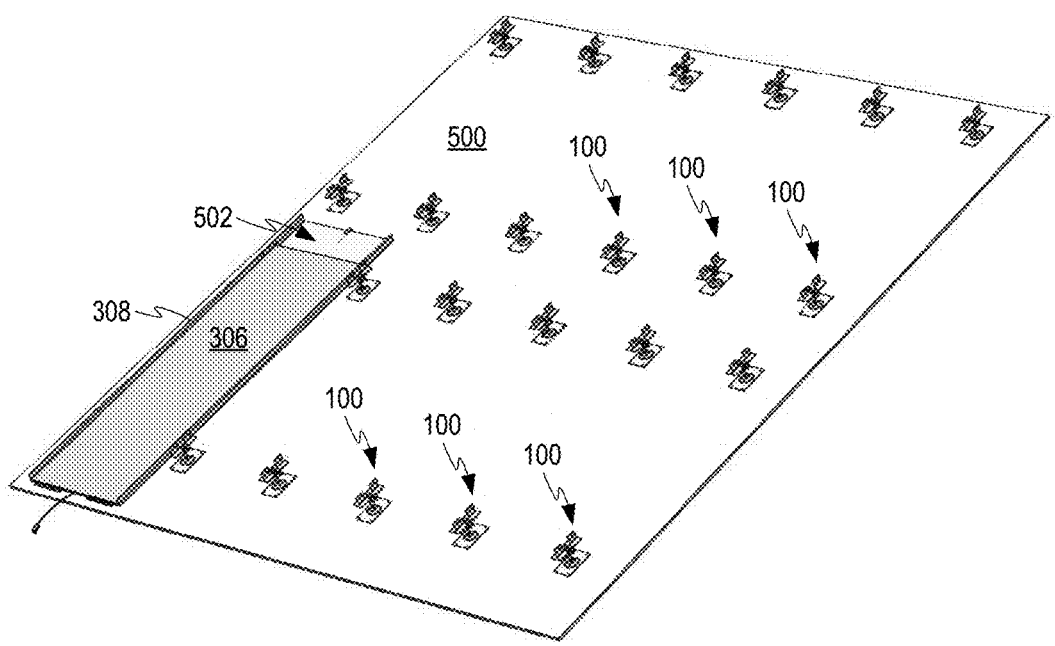
FIG. 5A shows an array of the support structures distributed across an exemplary rooftop according to various embodiments.

FIG. 5A shows an array of support structures 100 distributed across an exemplary rooftop 500. The support structures are depicted in a manner that allows four support structures to support each of photovoltaic module trays 308 and photovoltaic modules 306. Various embodiments may utilize a larger or smaller number of support structures 100 for each module tray 308. Also, while only a single photovoltaic module tray 308 is depicted in this figure, it should be appreciated that the depicted array of support structures 100 would be capable of supporting multiple photovoltaic module trays 308 and corresponding photovoltaic modules 306. In various embodiments, photovoltaic module tray 308 includes an interlock region 502 configured to receive a portion of another photovoltaic module tray positioned immediately above photovoltaic module tray 308.

Figure 5B:
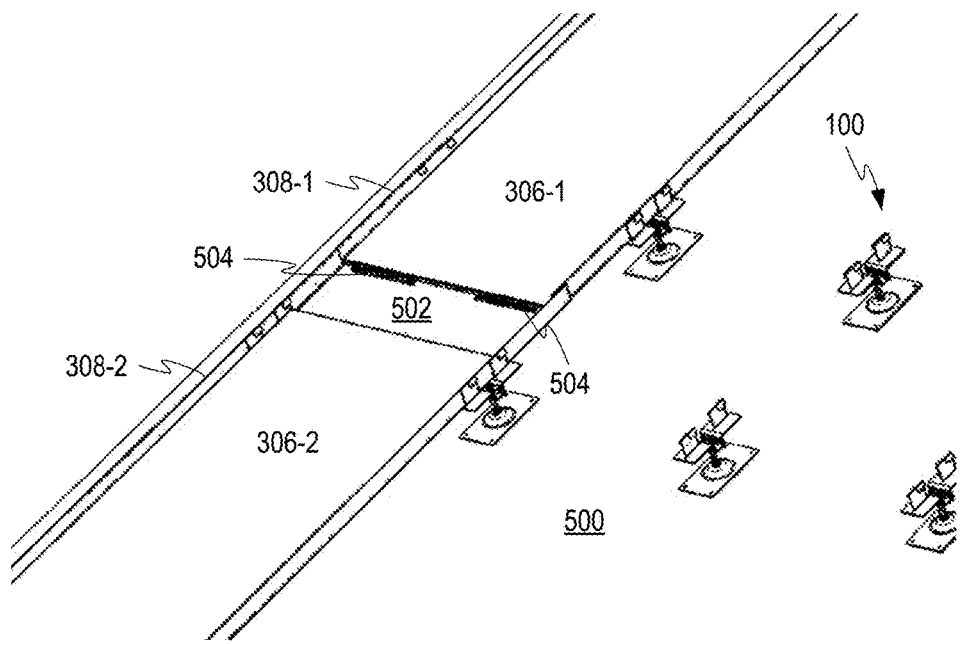
FIGS. 5B-5C show a portion of the rooftop depicted in FIG. 5A and how one photovoltaic module tray engages an interlock region of another photovoltaic module tray according to various embodiments.
Figure 5C:
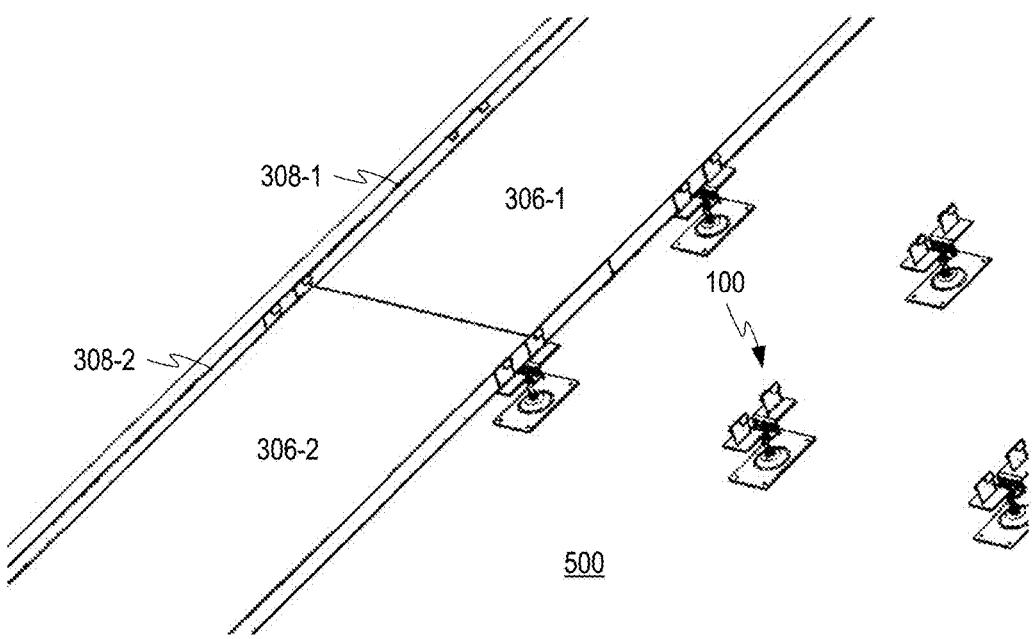

FIG. 5B shows a portion of rooftop 500 and how photovoltaic module tray 308-1 initially engages interlock region 502 of photovoltaic module tray 308-2. In particular a bottom end of photovoltaic module tray 308-1 can be slightly narrower than a top end of photovoltaic module tray 308-2 so that the bottom end of photovoltaic module tray 308-1 fits between the sidewalls of photovoltaic module tray 308-2. In some embodiments, interlock region 502 can be slightly deeper than lower portions of photovoltaic module tray 308-2 in order to receive engaging members 504 associated with photovoltaic module tray 308-2. FIG. 5C shows a final position of photovoltaic module tray 308-1 with respect to photovoltaic module tray 308-2. In this way, photovoltaic modules 306-1 and 306-2 can be placed in direct contact with one another to further reduce the spacing between adjacent photovoltaic modules. Photovoltaic module tray 308-2 can also be operative as a stop to prevent photovoltaic module tray 308-1 from slipping down rooftop 500.

Figure 6A:
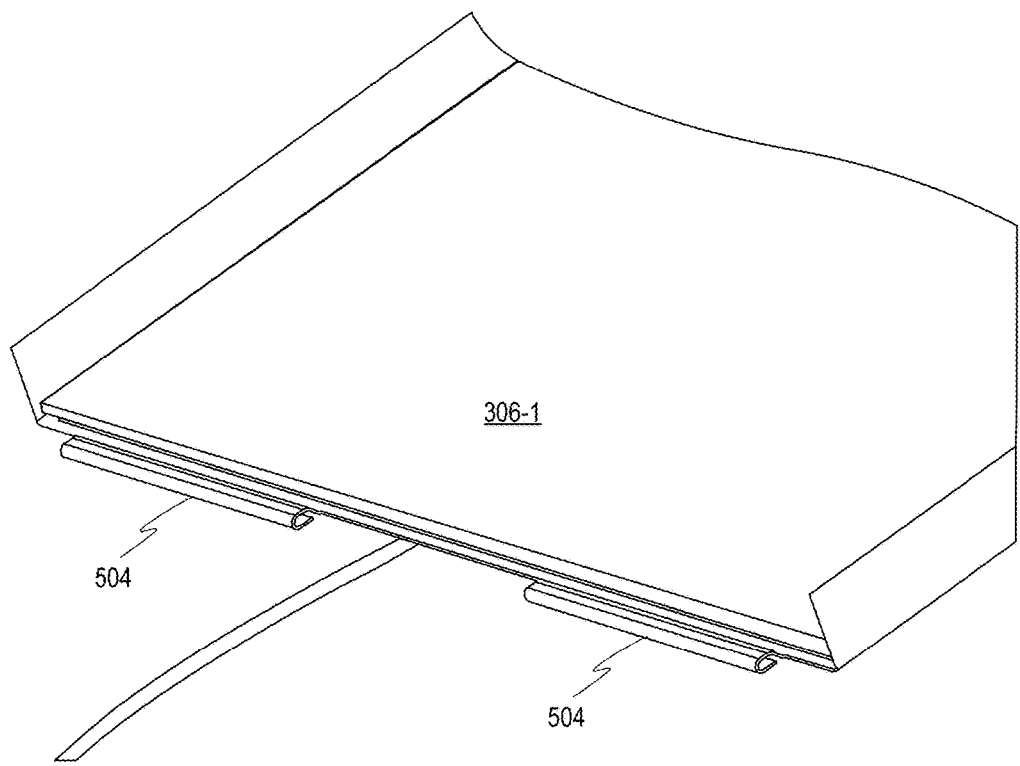
FIG. 6A shows a perspective view of a bottom edge of the photovoltaic module tray and depicts one configuration of photovoltaic module tray engaging members suitable for attaching the bottom edge of the photovoltaic module tray to another photovoltaic module tray.
Figure 6B:
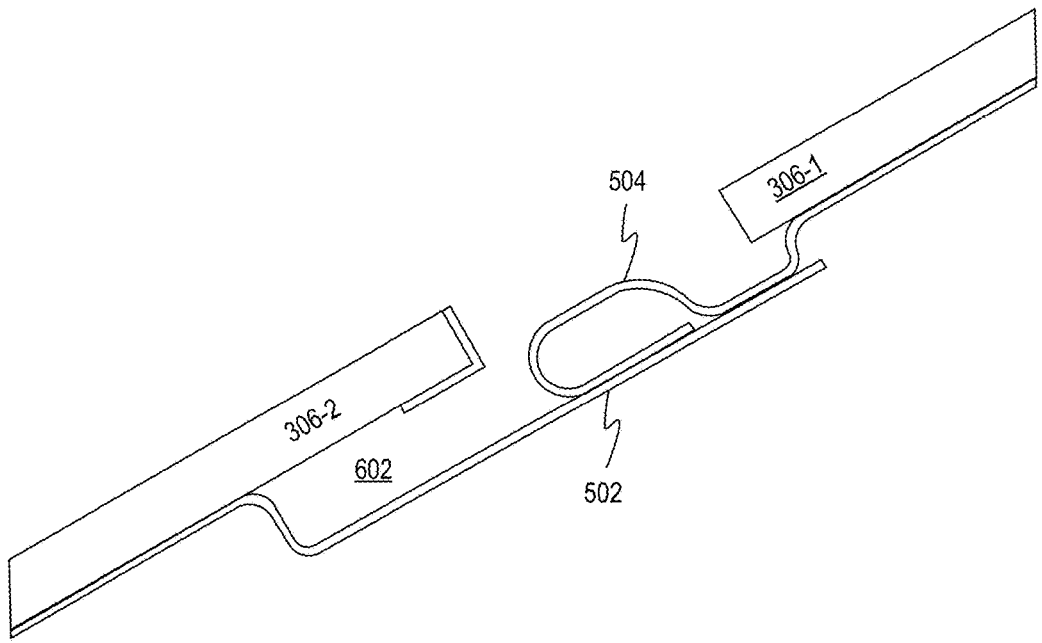
FIGS. 6B-6C show cross-sectional views of two photovoltaic module trays approaching and engaging one another with engaging members.

FIG. 6A shows a bottom edge of photovoltaic module tray 308-1 and depicts one configuration of engaging members 504. In the depicted embodiment, engaging members 504 can take the form of rounded hooks configured to engage a slot in an upper portion of photovoltaic module tray 308-2 (not depicted). FIG. 6B shows how engaging members 504 slides along interlock region 502 of photovoltaic module tray 308-2 towards recess 602. Recess 602 can be defined by a bottom-facing surface of photovoltaic module 306-2 and an upward-facing surface of interlock region 502 of photovoltaic module tray 308-2.

Figure 6C:
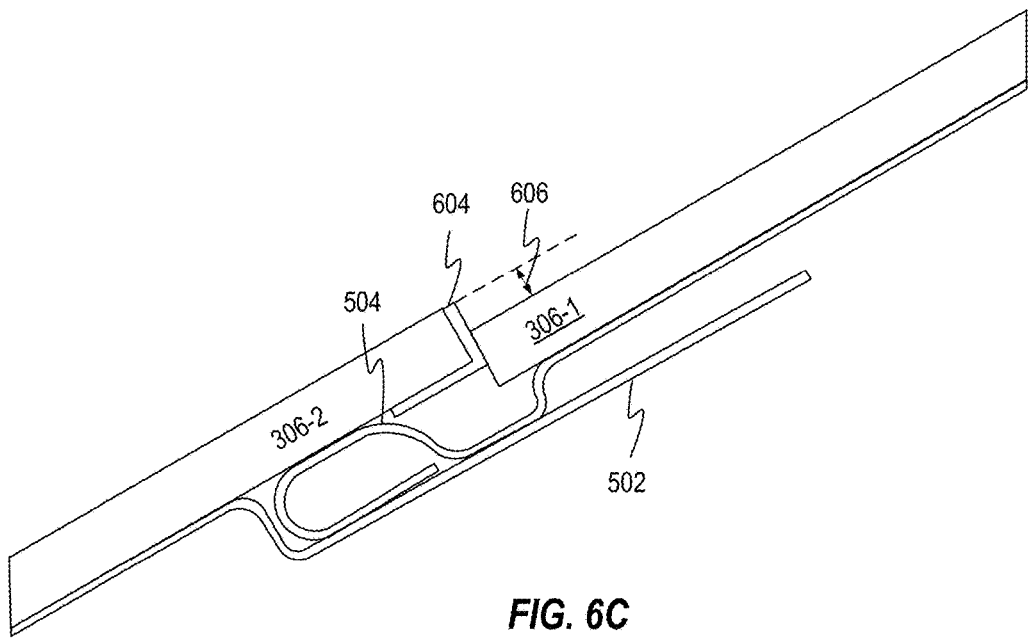

FIG. 6C shows how engaging member 504 can be slightly taller than recess 602, forcing engaging member 504 to compress as it lodges within recess 602. In some embodiments, an insulating layer 604 can be positioned along an upper portion of photovoltaic module 306-2. A thickness of insulating layer 604 can reduce the likelihood of engaging member 504 inadvertently pulling out of recess 602. Insulating layer 604 can also help prevent unintended interaction between photovoltaic modules 306-1 and 306-2. FIG. 6C also shows how photovoltaic module 306-1 can be arranged slightly lower than photovoltaic module 306-2 by a distance 606. Distance 606 can be on the order of between one and three millimeters. This offset helps mask the interface between photovoltaic modules 306-1 and 306-2 giving someone viewing the photovoltaic modules from the ground the impression that photovoltaic modules 306-1 and 306-2 are one continuous photovoltaic module.

Figure 7A:
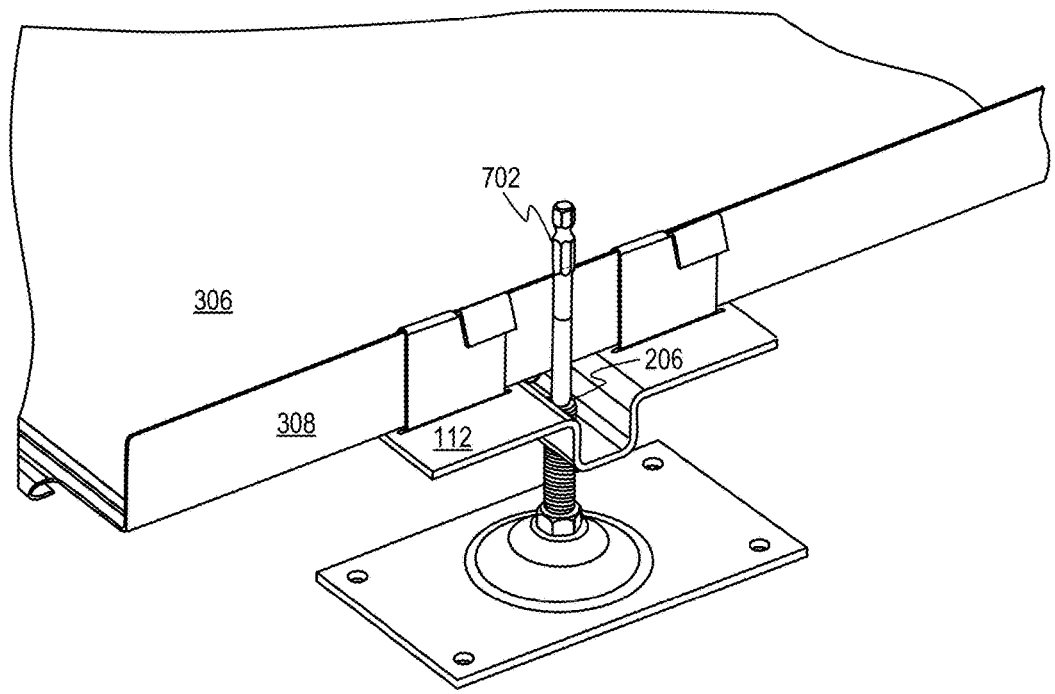
FIG. 7A shows how a driver can be used to engage a screw drive of a fastener of a support structure according to various embodiments.
Figure 7B:
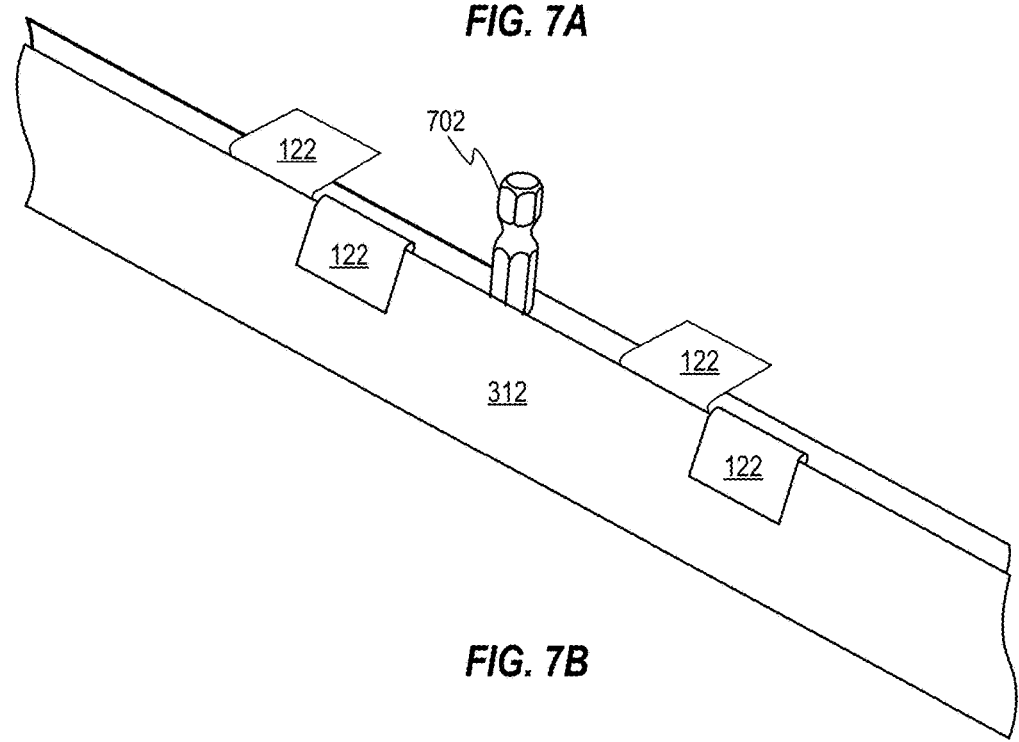
FIG. 7B shows how by releasing at least one sidewall from locking tabs, driver 702 can be inserted between sidewalls to adjust the height of a support structure.

FIGS. 7A-7B show how driver 702 can be used to engage screw drive 206 of fastener 102 to raise or lower the height of bracket 112 with respect to baseplate 114. As depicted, driver 702 can be rotated while photovoltaic module tray 308 is still attached to support bracket 112. In this way, a height of support bracket 112 above baseplate 104 can be fine-tuned and/or leveled while photovoltaic module tray 308 is still attached to support bracket 112. FIG. 7B shows how by releasing at least one of sidewalls 312 from locking tabs 122, as depicted, driver 702 can fit between sidewalls 312 to adjust the height of support structure 100. Though not shown, removal of a top cap covering the seam between the adjacent photovoltaic modules 306 and pans 308 may be necessary before accessing screw drive 206.

Figure 8A:
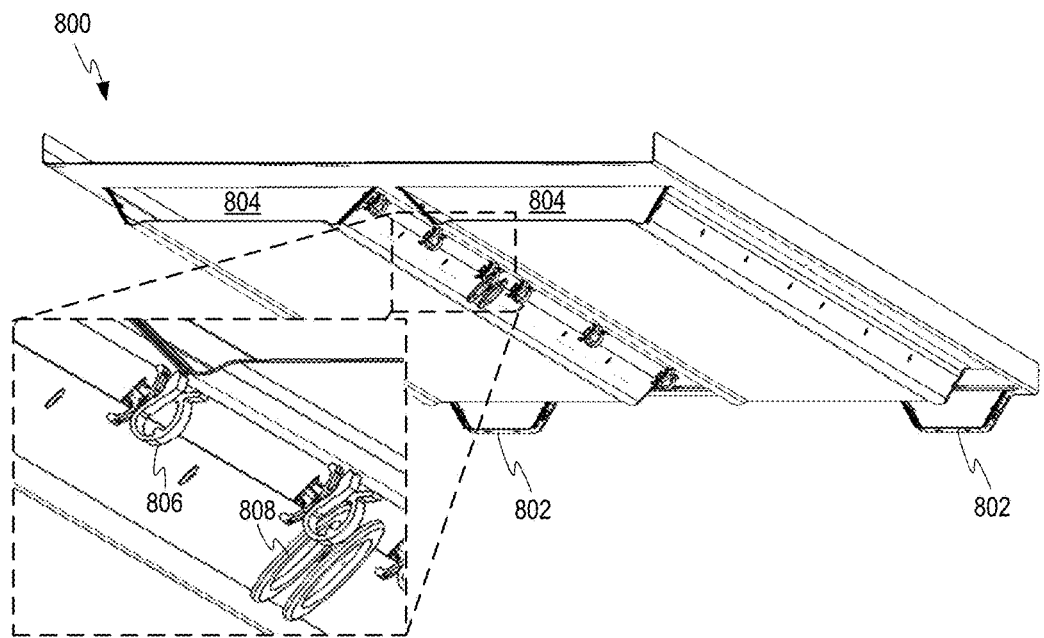
FIGS. 8A-8C show an alternative photovoltaic module tray that includes a different type of engaging member configuration according to various embodiments.
Figure 8B:
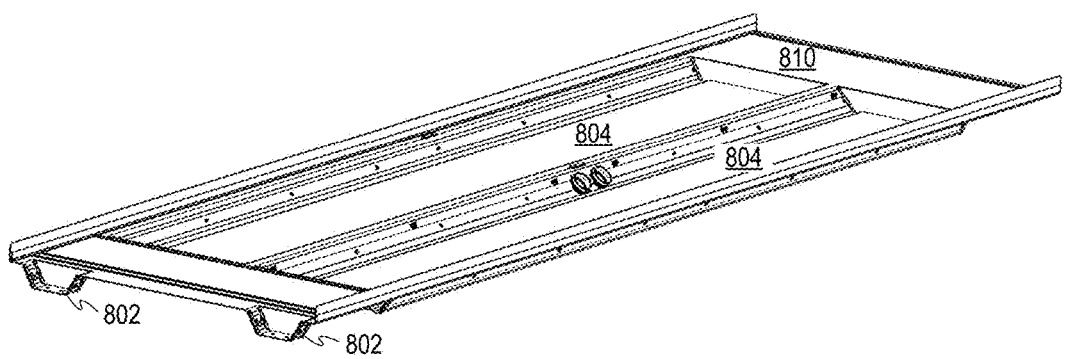
Figure 8C:
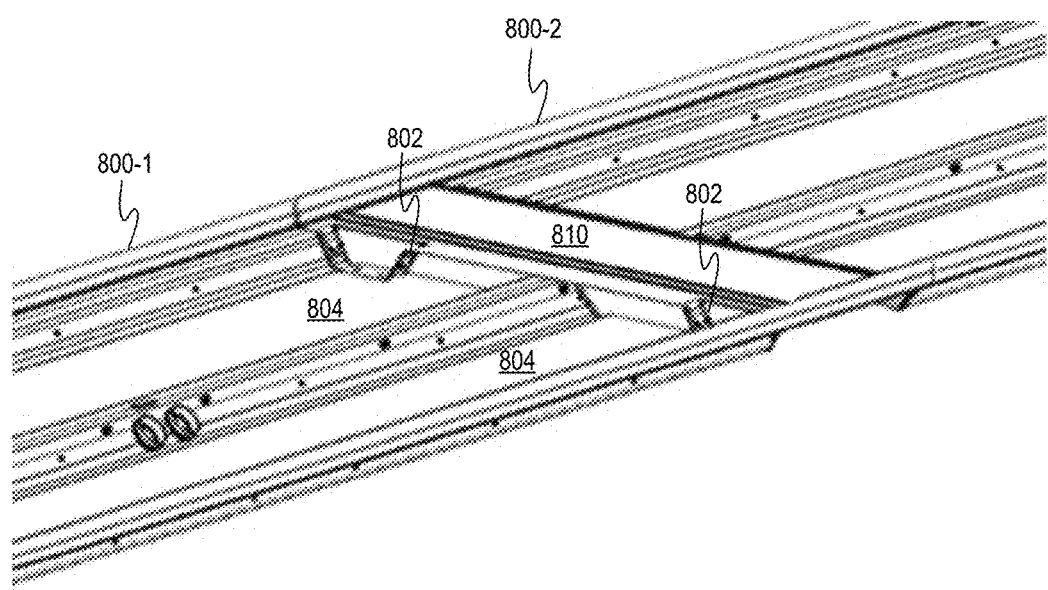

FIGS. 8A-8C show an alternative photovoltaic module tray 800 that includes a different type of engaging member configuration. In particular, FIG. 8A shows a bottom perspective view of photovoltaic module tray 800 with engaging members 802. Photovoltaic module tray 800 also includes recessed regions 804, which can create a channel for air to cool a downward facing surface of photovoltaic modules supported by photovoltaic module tray 800. FIG. 8A also shows a close-up view of cable clips 806 and cable ports 808 for routing cabling supporting photovoltaic modules between recessed regions 804.

FIG. 8B shows a top perspective view of photovoltaic module tray 800. As depicted, engaging members 802 can take the form of protruding lengths of metal extending down about the same distance as the portions of photovoltaic module tray 800 defining recessed regions 804. Similar to the previously described photovoltaic module trays, photovoltaic module tray 800 includes an interlock region 810 configured to receive a portion of an adjacent (e.g. up-roof/down-roof) photovoltaic module tray. In particular, FIG. 8C shows how photovoltaic module tray 800-1 can be overlapped by photovoltaic module tray 800-2. Engaging member 802 of photovoltaic module tray 800-2 are shown engaged within recessed regions 804 of photovoltaic module tray 800-1. In this way, engaging members 802 interact with a portion of photovoltaic module tray 800-1 that defines recessed region 804 to interlock photovoltaic module trays 800-1 and 800-2. It should be noted that in some embodiments, photovoltaic module trays 800-1 and 800-2 could secured directly against a surface of the roof on account of recessed regions 804 providing passageways through which air can cool a rear facing surface of a photovoltaic module being supported by one of photovoltaic module trays 800. Alternatively, photovoltaic module trays 800 could also be used with support structures.

Figure 9:
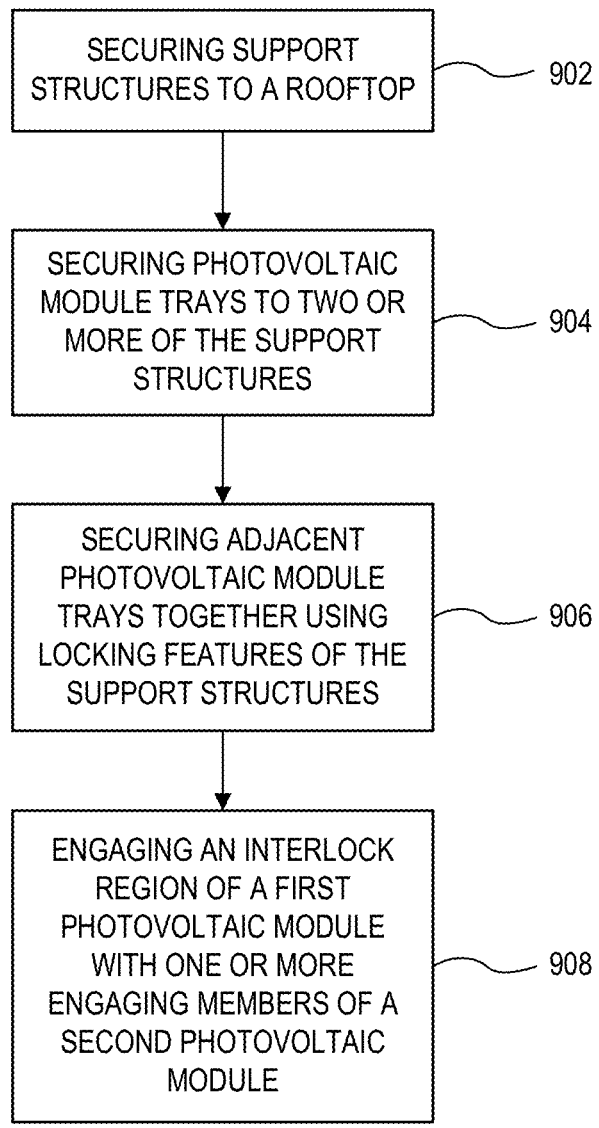
FIG. 9 shows a flow chart depicting a method for mounting photovoltaic modules on a rooftop according to various embodiments.

FIG. 9 shows a flow chart depicting a method for mounting photovoltaic modules on a rooftop using support structure 100 according to various embodiments of the disclosure. At 902, support structures are secured to a rooftop. Securing the support structures to the rooftop can include inserting a fastener through a fastener opening defined by a raised portion of a baseplate, using a plurality of fasteners to secure the baseplate to the rooftop, threading a washer and nut around a threaded shaft of the fastener, tightening the nut against the raised portion of the baseplate, twisting a support bracket around a distal end of the fastener and attaching one or more locking features to the support bracket. The support structures can be arranged in a two-dimensional pattern corresponding to a width and length of photovoltaic module trays used to support the photovoltaic modules. At 904, each of the photovoltaic module trays can be positioned atop the support structures so that the support structures support at or near corner regions of the photovoltaic module trays. At 906, the locking features of the support structures can be folded over sidewalls of the photovoltaic module trays to secure the photovoltaic module trays in place with respect to the support structures. At 908, engaging members of adjacent photovoltaic module trays can engage interlock regions of photovoltaic module trays positioned down roof from the photovoltaic module trays. In this way, the engaging members can couple photovoltaic module trays arranged in a single column together. This process may be repeated across the roof (e.g., from left to right), resulting in an integrated roof and array of photovoltaic modules that are coupled together.

Figure 10A:
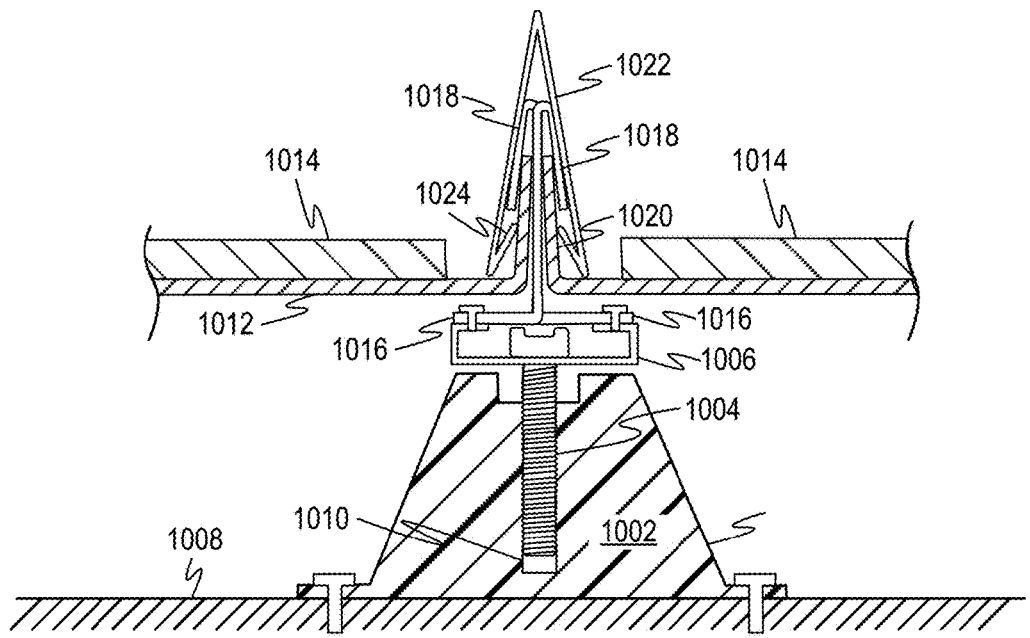
FIGS. 10A-10E show cross-sectional side views of alternative support structure embodiments according to various embodiments.

FIGS. 10A-10E show cross-sectional views of alternative support structures according to various embodiments of the disclosure. In particular, FIG. 10A shows how base 1002 can be configured to receive a threaded end of threaded fastener 1004. A vertical height of support bracket 1006 above support surface 1008 (e.g. a rooftop) can be set by adjusting how deeply threaded fastener 1004 is inserted into threaded aperture 1010 of base 1002. This in turn adjusts the height of attached trays 1012, which in turn support photovoltaic modules 1014. Locking features 1016 include locking tabs 1018, which are depicted engaging sidewalls 1020 of tray 1012. Subsequent to securing locking tabs 1018 to sidewalls 1020, waterproofing feature 1022 can be secured to locking tabs 1018 to prevent water from passing between adjacent trays 1012. Waterproofing feature 1022 may have a substantially constant cross-section extending along a length of trays 1012. Waterproofing feature 1022 may also include arms 1024 that can engage locking tabs 1014 to resist removal of waterproofing feature 1022. Arms 1024 may be helpful in high winds to prevent waterproofing feature 1022 from becoming disengaged from locking tabs 1018 during periods of high winds.

Figure 10B:
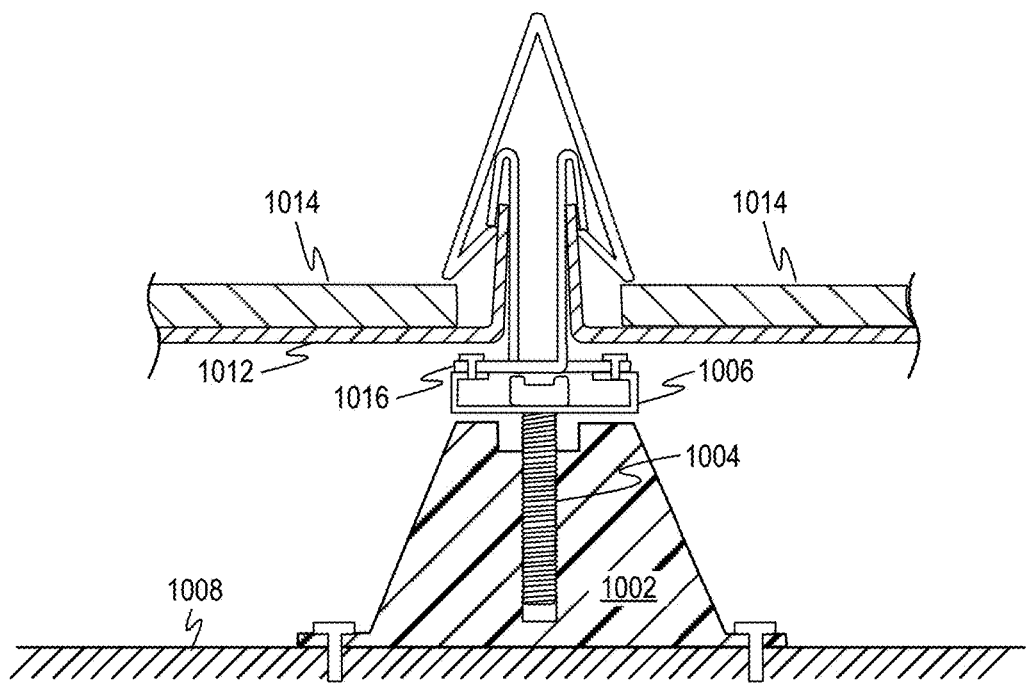

FIG. 10B shows how locking features 1016 can be offset from one another to leave an opening between trays 1012. The opening can be helpful to allow subsequent rotation of threaded fastener 1004 within base 1002 by allowing space for a driver to rotate threaded fastener 1004. In this way, the vertical height of individual support structures can be adjusted without disengaging locking tabs 1018 from trays 1012. It should be noted that in some embodiments, threaded fastener 1004 could be engaged within a threaded opening in the roof structure itself instead of having to separately attach base 1002 to the support structure.

Figure 10C:
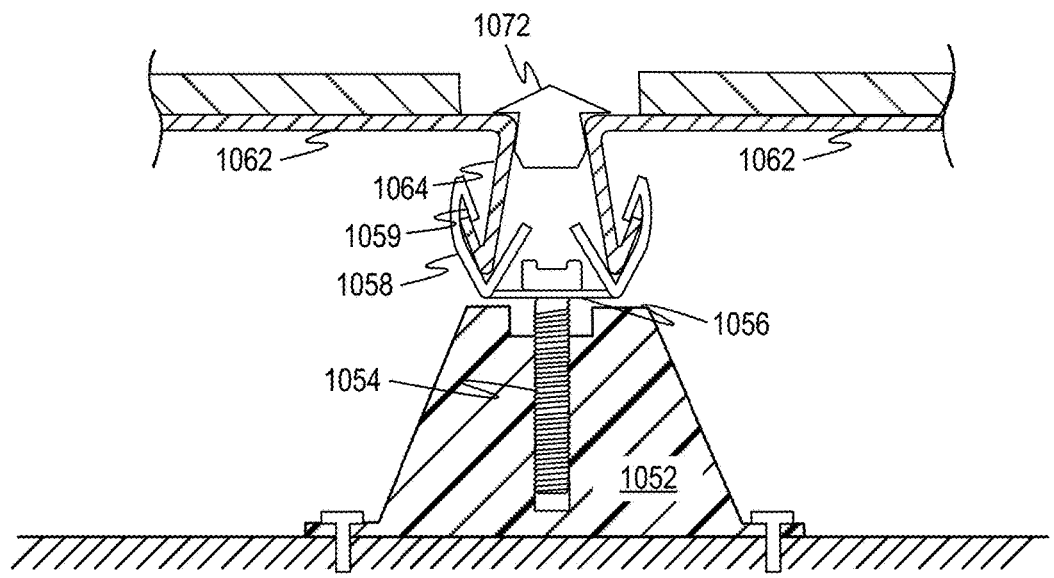

FIG. 10C shows an inverted seam support structure embodiment configured to support an inverted tray configuration that has an advantage over previously discussed tray configurations on account of the sidewalls of the tray no longer causing partial shading of the photovoltaic modules at certain sun angles. As depicted, sidewalls 1064 of trays 1062 face down to engage locking features 1058 of support bracket 1056. Another benefit of this configuration is that locking features 1058 and support bracket 1056 can be a single piece. In the depicted embodiment, locking features 1058 also include arms 1059 which are configured to retain the hooked ends of sidewalls 1064. This configuration also provides an opening between trays 1062 for a driver to twist threaded fastener 1054 once waterproofing feature 1072, which fits between trays 1062, is removed.

Figure 10D:
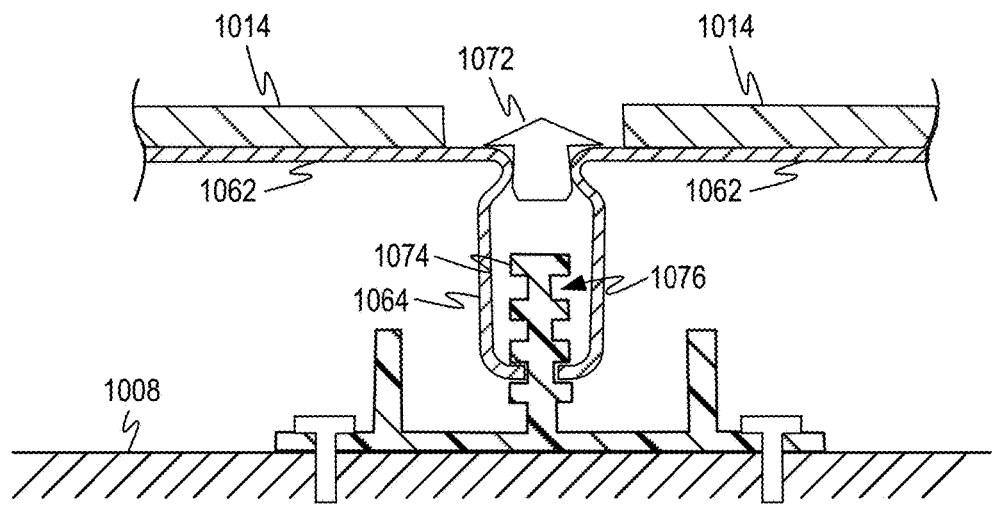

FIG. 10D shows another support structure embodiment configured to support inverted tray configurations. In the embodiment shown in FIG. 10D, distal ends of sidewalls 1064 are configured to engage notched support structure 1074. Notched support structure 1074 defines a number of discrete channels 1076 that allow trays 1062 to be attached to tree structure 1074 at varying heights. Sidewalls 1064 of trays 1062 can be configured to flex away from notched support structure 1074 in order to change a height of photovoltaic modules 1014 above support surface 1008 in response to downward or upward pressure exerted upon trays 1062.

Figure 10E:
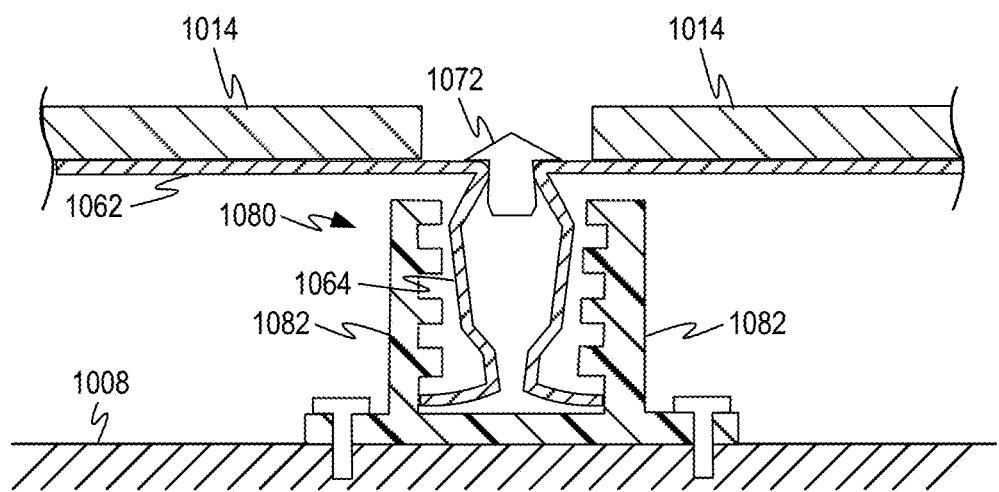

FIG. 10E shows yet another support structure embodiment configured to support inverted tray configurations. Inverted support structure 1080 includes two protrusions 1082 defining lateral facing channels 1076 sized to receive distal ends of sidewalls 1064 of trays 1062. In some embodiments, the curved geometry of the distal ends of sidewalls 1064 shown in FIGS. 10D and 10E allows trays 1062 to be adjusted vertically towards or away from support surface 1008 without removing waterproofing feature 1072.

The various aspects, embodiments, implementations or features of the described embodiments can be used separately or in any combination.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A photovoltaic module array, comprising:
a photovoltaic module;
a photovoltaic module tray supporting the photovoltaic module;
a base coupled to a rooftop and defining a fastener opening;
a fastener, comprising a threaded shaft extending through the fastener opening, the threaded shaft having a head at a first end of the threaded shaft and a screw drive defined by a second end of the threaded shaft; and
a support member comprising a recessed central portion and lateral wings arranged on opposing sides of the recessed central portion, the recessed central portion defining a threaded aperture engaged by a portion of the threaded shaft,
wherein the lateral wings support one side of the photovoltaic module tray.

2. The photovoltaic module array as recited in claim 1, wherein rotation of the fastener translates the support member in a direction aligned with a longitudinal axis of the fastener.

3. The photovoltaic module array as recited in claim 1, further comprising locking features protruding from each of the lateral wings.

4. The photovoltaic module array as recited in claim 3, wherein each of the locking features comprises a locking tab folded over a sidewall of the photovoltaic module tray.

5. The photovoltaic module array as recited in claim 1, wherein a portion of the base defining the fastener opening protrudes away from the rest of the base and is sized to accommodate the head of the fastener between a supporting surface to which the base is mounted and the portion of the base that defines the fastener opening.

6. The photovoltaic module array as recited in claim 1, wherein the photovoltaic module tray is a first photovoltaic module tray and the photovoltaic module array further comprises a second photovoltaic module tray adjacent to the first photovoltaic module tray, wherein the lateral wings support both the first and second photovoltaic module trays.

7. The photovoltaic module array as recited in claim 1, wherein the photovoltaic module tray comprises:
a bottom wall and sidewalls integrally formed with the bottom wall and disposed on opposing lateral sides of the bottom wall, the photovoltaic module being positioned between the sidewalls; and
an engaging member disposed at a front side of the bottom wall and an interlock region disposed at a rear side of the bottom wall, the interlock region being configured to cooperate with an engaging member of another photovoltaic module tray to secure the rear side of the bottom wall to a front side of the other photovoltaic module tray.

8. The photovoltaic module array as recited in claim 7, wherein the support member supports the bottom wall of the photovoltaic module tray above a rooftop upon which the photovoltaic module array is positioned.

9. The photovoltaic module array as recited in claim 7, wherein the engaging member of the other photovoltaic module tray comprises a compressible hook.

10. The photovoltaic module array as recited in claim 9, wherein a surface of the interlock region cooperates with a downward facing surface of the photovoltaic module to define a slot configured to capture the compressible hook.

11. The photovoltaic module array as recited in claim 7, wherein the bottom wall defines a number of openings through which cabling can be routed beneath the photovoltaic module tray.

12. The photovoltaic module array as recited in claim 7, wherein the lateral sides of the bottom wall are substantially longer than front and rear sides of the bottom wall.

13. A mounting system for a photovoltaic roofing system, comprising:
a base mounting bracket, comprising a base portion having a substantially planar geometry and a threaded member projecting away from the base portion; and
a support member having a pair of lateral wings and a central recessed portion, the central recessed portion comprising a threaded through-hole engaging the threaded member, and each lateral wing comprising a slot accommodating a vertical module tray connector that bisects the lateral wing and that includes a pair of opposing attachment tabs for securing a pair of adjacent module trays to either side of the bisected lateral wing.

14. The mounting system as recited in claim 13, further comprising:
a plurality of base mounting brackets and corresponding support members distributed across a rooftop.

15. The mounting system as recited in claim 14, further comprising a photovoltaic module tray elevated above the rooftop by two or more of the corresponding support members.

16. The mounting system as recited in claim 15, wherein the photovoltaic module tray comprises:
a bottom wall and sidewalls integrally formed with the bottom wall, the sidewalls disposed on opposing lateral sides of the bottom wall and separated by an interval sized to accommodate a photovoltaic module between the sidewalls; and
an engaging member disposed at a front side of the bottom wall and an interlock region disposed at a rear side of the bottom wall, the interlock region being configured to cooperate with an engaging member of another photovoltaic module tray to secure the rear side of the bottom wall to a front side of the other photovoltaic module tray.

17. A photovoltaic array, comprising:
a plurality of photovoltaic modules distributed across a rooftop, each of the plurality of photovoltaic modules comprising:
a photovoltaic module tray;
a photovoltaic module disposed within and supported by the photovoltaic module tray; and
two or more support structures elevating the photovoltaic module tray above a rooftop, each of the support structures comprising:
a base coupled to a rooftop;
a threaded shaft extending from the base; and
a support member comprising a recessed central portion and lateral wings arranged on opposing sides of the recessed central portion, the recessed central portion defining a threaded aperture engaged by a portion of the threaded shaft, the lateral wings supporting one side of the photovoltaic module tray.

18. The photovoltaic array as recited in claim 17, wherein each of the lateral wings defines a slot accommodating a vertical module tray connector that bisects the lateral wing and that includes a pair of opposing attachment tabs for securing a pair of adjacent module pans to either side of the bisected lateral wing.

19. The photovoltaic array as recited in claim 17, wherein the threaded shaft defines a screw drive and wherein engagement of the screw drive and rotation of the threaded shaft adjusts a vertical position of the support member, allowing for fine adjustment of a height of the photovoltaic module tray above the rooftop.

20. The photovoltaic array as recited in claim 17, wherein a first end of the photovoltaic module tray comprises engaging members that engage an interlock region of a down-roof photovoltaic module tray.

* * * * *